(12) United States Patent
Dhuler et al.

(10) Patent No.: US 6,410,361 B2
(45) Date of Patent: Jun. 25, 2002

(54) METHODS OF FABRICATING IN-PLANE MEMS THERMAL ACTUATORS

(75) Inventors: Vijayakumar R. Dhuler, Raleigh; Edward Hill, Chapel Hill; Allen Cowen, Cary, all of NC (US)

(73) Assignee: JDS Uniphase Corporation, Research Triangle Park, NC (US)

( * ) Notice: Subject to any disclaimer, the term of this patent is extended or adjusted under 35 U.S.C. 154(b) by 0 days.

(21) Appl. No.: 09/777,749

(22) Filed: Feb. 6, 2001

Related U.S. Application Data

(62) Division of application No. 09/395,068, filed on Sep. 13, 1999, now Pat. No. 6,211,598.

(51) Int. Cl.$^7$ .......................... H01L 21/00; H02N 1/04; H01H 37/00; H01H 61/00; H01H 37/52
(52) U.S. Cl. .......................... 438/54; 438/52; 310/307; 337/3; 337/333
(58) Field of Search .............................. 438/50, 51, 52, 438/53, 54, 55; 310/306, 307, 330, 332; 337/3, 333; 73/862.632–862.634, 504.41–504.15

(56) References Cited

U.S. PATENT DOCUMENTS

| | | | | |
|---|---|---|---|---|
| 5,536,963 A | * | 7/1996 | Polla | 257/417 |
| 5,576,251 A | * | 11/1996 | Gaabedian et al. | 437/228 |
| 5,781,331 A | * | 7/1998 | Carr et al. | 359/288 |
| 5,786,621 A | | 7/1998 | Saif et al. | |

(List continued on next page.)

FOREIGN PATENT DOCUMENTS

| | | |
|---|---|---|
| DE | 3809597 | 5/1989 |
| EP | 0469749 | 5/1992 |
| EP | 0478956 | 8/1992 |
| EP | 0665590 | 2/1995 |
| FR | 764821 | 5/1934 |

OTHER PUBLICATIONS

Silicon Fusion Bonding and Deep Reactive Ion Etching: A New Technology for Microstructures; E. H. Klaassen et al.; Sensors and Actuators A52 (1996), pp. 132–139.

(List continued on next page.)

Primary Examiner—John F. Niebling
Assistant Examiner—Viktor Simkovic
(74) Attorney, Agent, or Firm—Myers Bigel Sibley & Sajovec

(57) ABSTRACT

A MEMS thermal actuator device is provided that is capable of providing linear displacement in a plane generally parallel to the surface of a substrate. Additionally, the MEMS thermal actuator of the present invention may provide for a self-contained heating mechanism that allows for the thermal actuator to be actuated using lower power consumption and lower operating temperatures. The MEMS thermal actuator includes a microelectronic substrate having a first surface and at least one anchor structure affixed to the first surface. A composite beam extends from the anchor(s) and overlies the first surface of the substrate. The composite beam is adapted for thermal actuation, such that it will controllably deflect along a predetermined path that extends substantially parallel to the first surface of the microelectronic substrate. In one embodiment the composite beam comprises two or layers having materials that have correspondingly different thermal coefficients of expansion. As such, the layers will respond differently when thermal energy is supplied to the composite. An electrically conductive path may extend throughout the composite beam to effectuate thermal actuation. In one embodiment of the invention a two layer composite beam comprises a first layer of a semiconductor material and a second layer of a metallic material. The semiconductor material may be selectively doped during fabrication so as to create a self-contained heating mechanism within the composite beam. The invention also comprises a MEMS thermal actuator that includes two or more composite beams. The two or more composite beams may be disposed in an array or a ganged fashion, such that the multiple composite beams benefit from overall force multiplication and are therefore capable of greater and more linear displacement distances. The invention is also embodied in a method for fabricating the MEMS thermal actuators of the present invention.

10 Claims, 8 Drawing Sheets-

U.S. PATENT DOCUMENTS

| | | | | |
|---|---|---|---|---|
| 5,796,152 | A | * 8/1998 | Carr et al. | 257/415 |
| 5,813,441 | A | 9/1998 | Dewispelaere | |
| 5,862,003 | A | 1/1999 | Saif et al. | |
| 5,870,007 | A | * 2/1999 | Carr et al. | 333/262 |
| 5,881,198 | A | 3/1999 | Haake | |
| 5,903,380 | A | * 5/1999 | Motamedi et al. | 359/224 |
| 5,909,078 | A | 6/1999 | Wood et al. | |
| 5,994,159 | A | 11/1999 | Aksyuk et al. | |
| 6,044,646 | A | * 4/2000 | Silverbrook | 60/528 |
| 6,067,797 | A | * 5/2000 | Silverbrook | 60/528 |
| 6,120,464 | A | * 10/2000 | Carr | 257/417 |
| 6,159,385 | A | * 12/2000 | Yao et al. | 216/2 |
| 6,316,796 | B1 | * 11/2001 | Petersen et al. | 257/254 |

OTHER PUBLICATIONS

Design and Development of Microswitches for Micro–Electro–Mechanical Relay Matrices; M. W. Phipps, Thesis, Air Force Inst. Of Tech., Wright–Patterson AFB, OH School of Engineering, 1995.

A Micro Mobile Mechanism Using Thermal Expansion and Its Theoretical Analysis—A Comparison With Impact Drive Mechanism Using Piezoelectric Elements, Y. Yumagata et al., Proceedings of the IEEE Micro Electro Mechanical Systems, 1994, pp. 142–147.

Thin Film Heater On A Thermally Isolated Microstructure, S. Oh et al., Mat. Res. Soc. Symp. Pro. vol. 276, 1992 Materials Research Society, pp. 277–282.

The Properties of Electrodeposited Metals & Alloys, W. H. Safranek, Amer. Electroplaters & Surface Finishers Society, 1986, pp. 295–315.

Silicon Fusion Bonding and Deep Reactive Ion Etching; A New Technology for Microstructures, E. H. Klassen et al., The 8$^{th}$ International Conference on Solid–State Sensors and Actuators, and Eurosensors IX, Stockholm, Sweden, Jun., 1995, pp. 556–559.

Fabrication of SOI Wafers With Buried Cavities Using Silicon fusion Bonding and Electrochemical Etchback, J. M. Noworolski et al., The 8$^{th}$ International Conference on Solid–State Sensors and Actuators, and Eurosensors IX, Stockholm, Sweden, Jun. 1995, pp. 71–74.

Single Crystal Silicon Actuators and Sensors Based on Silicon Fusion Bonding Technology, Semiannual Progress Report 1, Advanced Research Projects Agency, Lucas NovaSensor, Contract No. DAAL 01–94–C–3411, Apr.–Jul. 1994.

Single Crystal Silicon Actuators and Sensors Based on Silicon Fusion Bonding Technology, Semiannual Progress Report 2, Advanced Research Projects Agency, Lucas NovaSensor, Contract No. DAAL 01–94–C–3411, Jul. 1994–Jan. 1995.

Single Crystal Silicon Actuators and Sensors Based on Silicon Fusion Bonding Technology, Semiannual Progress Report, Advanced, Advanced Research Projects Agency, Lucas NovaSensor, Contract No. DAAL 01–94–C–3411, Jan.–Jul. 1995.

Single Crystal Silicon Actuators and Sensors Based on Silicon Fusion Bonding Technology, Semiannual Progress Report, Advanced Research Projects Agency, Lucas NovaSensor, Contract No. DAAL 01–94–C–3411, Jan.–Aug. 1996.

Surface Micromachined Linear Thermal Microactuator, J. W. Judy et al., International Electron Devices Meeting 1990, Technical Digest (CAT. No. 90CH2865–4), Dec. 1990, New York, NY, pp. 629–632.

Multimode Digital Control of a Suspended Polysilicon Microstructure, Journal of Microelectromechanical System, vol. 5, No. 4, Dec. 1986, pp. 283–297.

Applications for Surface–Micromachined Polysilicon Thermal Actuators and Arrays, J.H. Comtois et al., Sensors and Actuators, A 58 (1997) pp. 19–25.

Vertically Driven Microactuators by Electrothermal Buckling Effects, L. Lin et al. Sensors and Actuators, A 71 (1998) pp. 35–39.

* cited by examiner

METHODS OF FABRICATING IN-PLANE MEMS THERMAL ACTUATORS

Claim for Priority and Cross-Reference to other Applications

This application is a divisional of parent application Ser. No. 09/395,068 is now 6,211,598, filed Sep. 13, 1999, the disclosure of which is hereby incorporated herein by reference.

FIELD OF THE INVENTION

The present invention relates to microelectromechanical actuators, and more particular to a thermal actuator having self-contained heating capabilities and providing in-plane actuation.

BACKGROUND OF THE INVENTION

Microelectromechanical structures (MEMS) and other microengineered devices are presently being developed for a wide variety of applications in view of the size, cost and reliability advantages provided by these devices. Many different varieties of MEMS devices have been created, including microgears, micromotors, and other micromachined devices that are capable of motion or applying force. These MEMS devices can be employed in a variety of applications including hydraulic applications in which MEMS pumps or valves are utilized and optical applications that include MEMS light valves and shutters.

MEMS devices have relied upon various techniques to provide the force necessary to cause the desired motion within these microstructures. For example, cantilevers have been employed to transmit mechanical force in order to rotate micromachined springs and gears. In addition, some micromotors are driven by electromagnetic fields, while other micromachined structures are activated by piezoelectric or electrostatic forces. Recently, MEMS devices that are actuated by the controlled thermal expansion of an actuator or other MEMS component have been developed. For example, U.S. patent application Ser. Nos. 08/767,192; 08/936,598, and 08/965,277 are assigned to MCNC, the assignee of the present invention, and describe various types of thermally actuated MEMS devices. In addition, MEMS devices have been recently developed that include rotational connections to allow rotation with less torsional stress and lower applied force than found with torsion bar connections. For instance, U.S. patent application Ser. No. 08/719,711, also assigned to MCNC, describes various rotational MEMS connections. The contents of each of these applications are hereby incorporated by reference herein.

Thermally actuated MEMS devices that rely on thermal expansion of the actuator have recently been developed to provide for actuation in-plane, i.e. displacement along a plane generally parallel to the surface of the microelectronic substrate. However, these thermal actuators rely on external heating means to provide the thermal energy necessary to cause expansion in the materials comprising the actuator and the resulting actuation. These external heaters generally require larger amounts of voltage and higher operating temperatures to affect actuation. For examples of such thermally actuated MEMS devices see U.S. Pat. No. 5,881,198 entitled "Microactuator for Precisely Positioning an Optical Fiber and an Associated Method" issued Mar. 9, 1999, in the name of inventor Haake, and U.S. Pat. No. 5,602,955 entitled "Microactuator for Precisely Aligning an Optical Fiber and an Associated Fabrication Method" issued Feb. 11, 1997, in the name of inventor Haake.

As such, a need exists to provide MEMS thermal actuated devices that are capable of generating relatively large displacement, while operating at significantly lower temperatures (i.e. lower power consumption) and consuming less area on the surface of a microelectronic substrate. These attributes are especially desirable in a MEMS thermal actuated device that provides relatively in-plane, linear motion and affords the benefit of having a self-contained heating mechanism.

SUMMARY OF THE INVENTION

A MEMS thermal actuator device is therefore provided that is capable of providing linear displacement in a plane generally parallel to the surface of a substrate. Additionally, the MEMS thermal actuator of the present invention may provide for a self-contained heating mechanism that allows for the thermal actuator to be actuated using lower power consumption and lower operating temperatures.

The MEMS thermal actuator includes a microelectronic substrate having a first surface and an anchor structure affixed to the first surface. A composite beam extends from the anchor and overlies the first surface of the substrate. The composite beam is adapted for thermal actuation, such that it will controllably deflect along a predetermined path that extends substantially parallel to the first surface of the microelectronic substrate. In one embodiment the composite beam comprises two or more layers having materials that have correspondingly different thermal coefficients of expansion. As such, the layers will respond differently when thermal energy is supplied to the composite. An electrically conductive path may extend throughout the composite beam to effectuate thermal actuation.

In one embodiment of the invention a two layer composite beam comprises a first layer of a semiconductor material and a second layer of a metallic material. The semiconductor material may be selectively doped during fabrication so as to create a self-contained heating mechanism within the composite beam. The doped semiconductor region may afford a path of least resistance for electrical current. The doping process may also enhance the fabrication of contacts on the surface of the anchor. Additionally, the composite beam, which is characterized by a high aspect ratio in the z plane direction, may be constructed so that the first and second layers lie in planes that are generally perpendicular to the first surface of the microelectronic substrate. The vertical layer of the composite beam provides for deflection of the beam along a predetermined path that extends generally parallel to the surface of the microelectronic substrate.

In another embodiment of the invention, a MEMS thermal actuator includes two or more composite beams. The two or more composite beams may be disposed in an array or a ganged fashion, such that the multiple composite beams benefit from overall force multiplication. In one such embodiment, two composite beams are disposed on the surface of a microelectronic substrate such that the ends of the beam farthest from the anchor structure face one another. An interconnecting element is operably connected to the free ends of the composite beam. The interconnecting element is configured so as to impart flexibility when the two composite beams are actuated in unison. The flexible nature of the interconnecting element allows for the overall MEMS thermal actuator device to impart a greater distance of linear deflection.

In yet another multi composite beam embodiment, two composite beams are disposed on the surface of a microelectronic substrate such that the ends of the beam farthest from the anchor structure face one another and the beams are proximate a flexible beam structure. The flexible beam structure comprises a platform disposed between two or more anchors affixed to the substrate. One or more flexible beams operably connect the platform and the anchors. The platform is adjacent to the free ends of the composite beams such that thermal actuation of the composite beam causes the beams to operably contact the platform and deflect it in a generally linear fashion. The flexible beam structure that houses the platform compensates for variances that may occur in the thermal actuation of the composite beams.

The invention is also embodied in a method for fabricating the MEMS thermal actuators of the present invention. The method comprises affixing a first microelectronic substrate to a second microelectronic substrate. After the second substrate has been thinned to a predetermined thickness, a first portion of the MEMS thermal actuator construct is then defined in the second microelectronic substrate, including the first layer of a composite beam and a portion of the anchor structure. A doping process may be undertaken to define a path of least resistance in the first layer of the composite beam. A second layer is disposed on the first layer, the second layer and first layer comprising different materials that respond differently to thermal actuation. The variance in thermal coefficients of expansion causing the first and second layers of the composite beam to actuate the composite beam along a predetermined path that extends substantially parallel to the surface of the microelectronic substrate.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The following description details MEMS thermal actuated devices that are capable of generating in-plane, linear motion and provide for a self-contained heating mechanism to effectuate thermal expansion of the materials comprising the actuator. The resulting MEMS thermal actuated devices are thereby capable of operating at significantly lower temperature and power while providing relatively large displacements. In addition, methods for fabricating such devices are provided herein.

Figure 1:
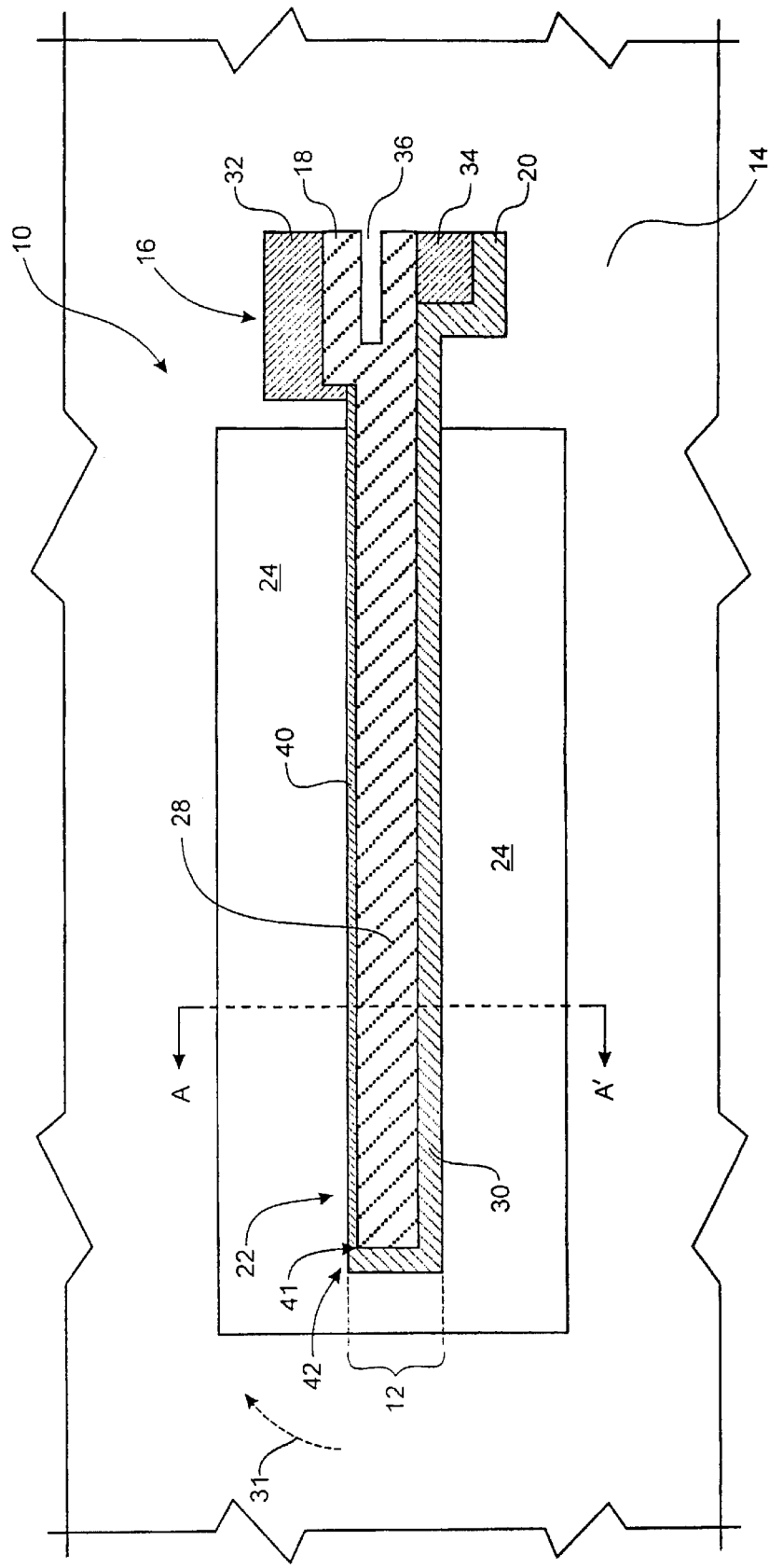
FIG. 1 is a plan view of a self-contained, in-plane, MEMS thermal actuator in accordance with an embodiment of the present invention.
Figure 1A:
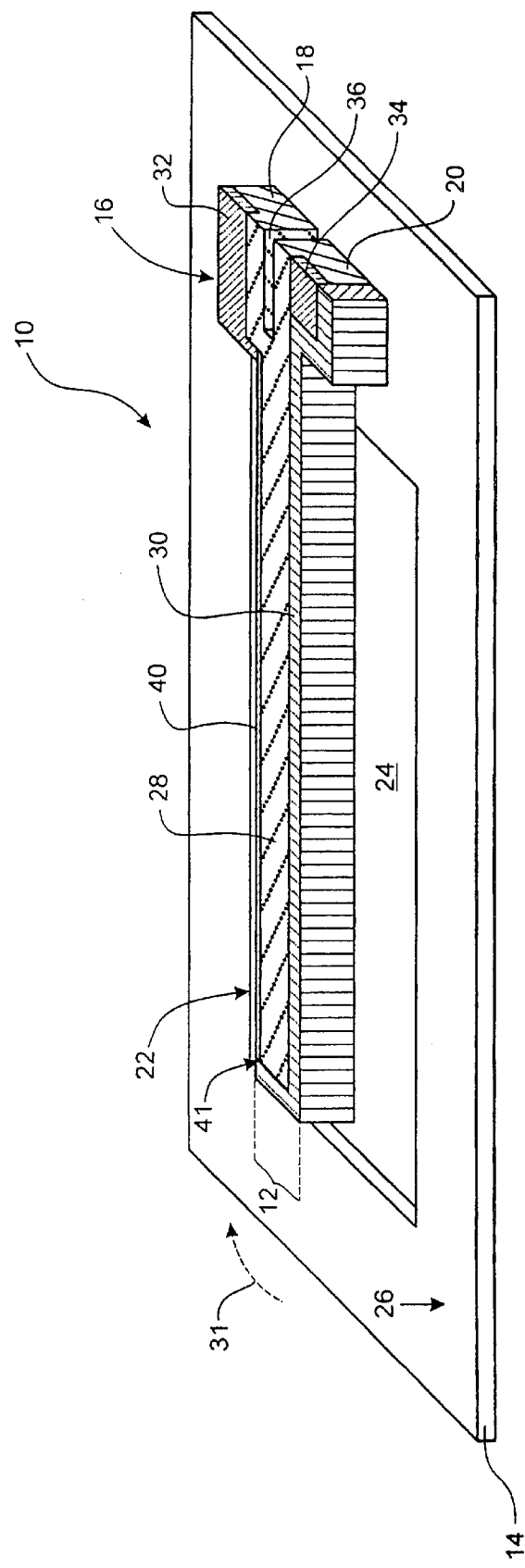
FIG. 1A is a perspective view of a self-contained, in-plane, MEMS thermal actuator in accordance with an embodiment of the present invention.
Figure 2:
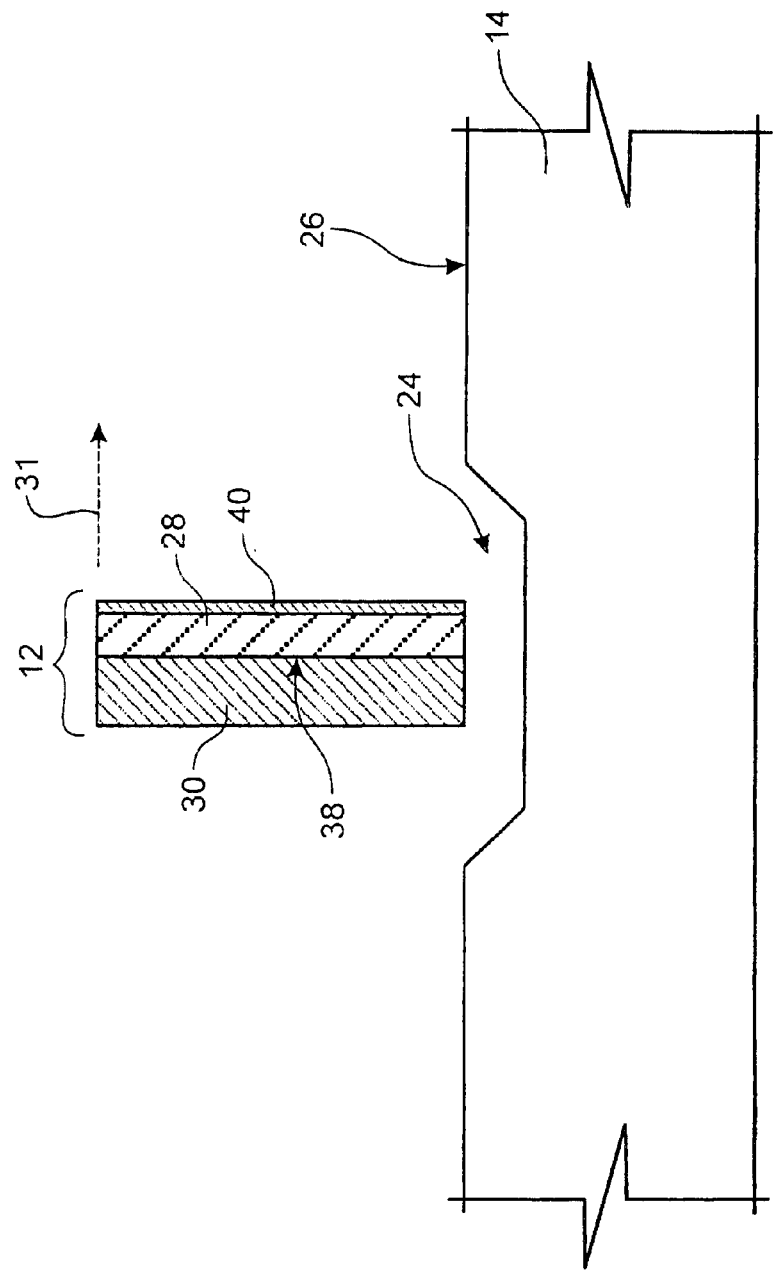
FIG. 2 is a cross-sectional view of the self-contained, in-plane, MEMS thermal actuator shown in FIG. 1, in accordance with an embodiment of the present invention.

Referring to FIGS. 1, 1A and 2, shown, respectively, are a top plan view, a perspective view and a cross-sectional end view of a self-contained, in-plane, MEMS thermal actuator 10 in accordance with one embodiment of the present invention. The thermal actuator comprises a composite beam 12 that is affixed to the microelectronic substrate 14. The composite beam is affixed, at proximal end 16, to the substrate via an anchor, shown in FIG. 1 as first anchor portion 18 and second anchor portion 20. From the proximal end, the composite beam extends outward, overlying the microelectronic substrate, and concluding in a distal end 22 disposed furthest from the anchor(s). As such, the composite beam overlies and is suspended above the microelectronic substrate in a cantilever-like configuration. Optionally, the thermal actuator of the present invention may define a trench 24 disposed in the surface 26 of the microelectronic substrate 14 that provides for additional thermal isolation between the composite beam and the microelectronic substrate. For example, the cross-sectional view of FIG. 2 depicts the suspended composite beam disposed above a trench defined in the microelectronic substrate.

The composite beam will comprise at least two materials that characteristically have different thermal coefficients of expansion. As depicted in FIG. 1, the composite beam includes a first layer 28 and a second layer 30. It is also possible and within the inventive concepts herein disclosed to construct the composite beam with more than two layers. As shown in FIG. 2, the first and second layers are disposed vertically in relationship to the surface of the microelectronic substrate. The vertical relationship of the layers is required to affect actuation in an in-plane direction, parallel with the generally planar surface of the microelectronic substrate, as shown by arrow 31. The first and second layers will, typically, be thin layers of about 1 micron to about 10 microns so as to facilitate flexibility and movement in the overall composite beam. Since the layers have different thermal coefficients of expansion, the layers will respond differently to thermal actuation resulting in deflection of the composite beam.

In one embodiment of the invention the first layer 28 may comprise a semiconductor material, such as silicon, and the second layer 30 may comprise a metallic material, such as gold or nickel. In this embodiment the second layer has a characteristically higher coefficient of thermal expansion than the first layer. Since the layer having the higher coefficient of expansion will expand more readily as temperature increases, the distal end of the composite beam will bend toward the layer having the lower coefficient of thermal expansion when thermal energy is supplied to the composite beam. In the embodiment described, in which the second layer 30 has the higher coefficient of thermal expansion, the layering relationship will effect movement of the beam to the right, toward the first layer 28, when reviewed in FIG. 2. It will be readily apparent to those having skill in the art, that the layering may be reversed, so that the material having the higher coefficient of thermal expansion is on the opposite side in the depicted embodiment and, thus, the movement of the beam will be to the left as viewed in FIG. 2. Altering various composite beam and thermal actuator characteristics can vary the amount of deflection observed in the composite beam. Included among these characteristics are the choice of materials used for the layers, the thickness of the layers, and the amount of heat supplied to the composite beam, and structural discontinuities in the layers.

The first and second anchor portions 18 and 20 serve to affix the composite beam 12 to the underlying substrate. The shape of the overall anchor and/or the anchor portions is shown by way of example only. The general shape and location of the anchors at the proximal end 16 will be dictated by many design factors, including but not limited to, the amount of composite beam deflection desired, the coefficients of thermal expansion of the composite beam materials, the desired rigidity of the overall thermal actuator, etc. First and second contacts 32 and 34 are disposed on respective first and second anchor portions 18 and 20. The contacts are interconnected with a source of electrical energy (not shown in FIG. 1) and serve as connection points for an electrical current that runs through the composite beam. The heat generated by the electrical current in the beam acts as the means for actuating the composite beam. In the embodiment shown the two anchor portions are separated by a gap 36. The gap serves as an insulator providing electrical insulation between the first and second contacts.

As mentioned above, the microelectronic substrate 14 may define a trench 24 in the region underlying the composite beam. Typically, the trench will be slightly longer than the length of the composite beam and the maximum deflection distance of the beam will dictate the width of the trench. The trench provides heating efficiency advantages. For example, the gap created by the trench between the composite beam and the microelectronic substrate provides thermal isolation and, thus, less heat loss is experienced between the composite beam and the substrate. Additionally, the trench simplifies the fabrication process used to deposit the metallic second layer 30 upon the first layer 28. In contrast with conventional horizontal type layering constructs, the layers of the composite beam are stacked vertically. To effectuate vertical layering the metallic second layer 30 is deposited at an angle to assure uniform coverage of the vertical sidewall 38 of the first layer (shown in FIG. 2). Without a trench in place, there is a likelihood that depositing the metallic second layer will lead to electrical shorting of the underlying microelectronic substrate and any metal elements defined on the substrate. Alternately, the MEMS thermal actuator of the present invention may be constructed without a trench defined in the microelectronic substrate. In such embodiments a release layer, typically an oxide layer, is used to release the composite beam from the surface of the substrate during fabrication. The releasing process results in a small gap, typically less that 1 micron, existing between the microelectronic substrate and the composite beam.

The composite beam is adapted for thermal actuation through direct, self-heating techniques using electric current. As previously discussed prior art in-plane, thermal actuators have used indirect heating techniques and have, thus, required large currents and high operating temperatures. As such, the high temperature, large current nature of prior art thermal actuators makes them less efficient than the thermal actuator of the present invention. In order to permit direct heating, each layer of the composite beam defines an electrically conductive path that runs in a continuous loop through the composite beam and between a first and second contacts 32 and 34 disposed upon the anchor portions 18 and 20. In this fashion, an electrical circuit is formed by passing current from one contact and through one of the layers of the composite beam to the distal end of the composite beam prior to returning to the other contact via the other layer. Preferably, the electrically conductive path is disposed so as to substantially surround at least one of the layers comprising the composite beam. It is possible and within the inventive concepts herein disclosed to alter the configuration of the electrically conductive path to form a circuit loop that will effectuate heat in the composite beam. The electrically conductive path has a predetermined electrical resistance so as to permit thermal actuation of the composite beam when electrical energy is supplied thereto.

The present invention uses controlled doping to facilitate self-heating and to customize the resistance characteristics of the non-metallic materials used in the thermal acuator construct. In this fashion the doped region of the composite beam acts as the heater, self-contained within the composite beam structure. Materials such as silicon are highly resistant and, thus, the doping of such materials aids in constructing a highly conductive path for the passage of electrical current. Highly doping silicon can be achieved with materials such as phosphorus or boron. The use of doping techniques is well known by those of ordinary skill in the art. It should also be noted that the embodiments herein described are not limited to internal heating to effectuate actuation. The MEMS thermal actuators shown here will operate with external heating and in certain embodiments, depending on the composition of the substrate and the materials used to form the actuator, ambient temperature actuation is possible.

In the embodiment shown in FIGS. 1 and 2, in which the first layer 28 comprises a semiconductor material, such as silicon, and the second layer 30 comprises a metal, such as gold, the external surface 40 of the first layer has been controllably doped. The second layer is electrically connected at junction 41 to the doped conductive surface of the first layer at the tip 42 of the distal end of the composite beam. The tip portion of the distal end may be fabricated so that it is either an extension of the second layer (as shown in FIG. 1) or it may comprise a continuation of the doped conductive region of the first layer leading into the second layer. Both alternative configurations will allow for the second layer to be electrically connected with the doped conductive surface of the first layer. Since the doped regions define a path of least electrical resistance, the electrical current will mostly follow the path defined by the doped portions of the first layer and the metallic second layer, with the undoped portion 28 being an electrical insulator. Accordingly, the conductive path is provided between the contacts 32 and 34 by the doped portion of the first layer and the metallic second layer. As shown, the contacts have also been doped to increase electrical conductivity. It is also possible to devise contacts that would not require doping. By way of example, when a source of electrical energy is applied between the contacts electrical current would flow from the first contact 32 along the external surface 40 of the first layer (i.e. the doped region of the first layer), through junction 41 into the interconnected second layer 30 and return back through the second layer to the second contact 34. In an alternate embodiment the electrical current could flow in the opposite direction, emanating from the second contact, flowing through the composite beam and completing the path at the first contact.

Figure 3:
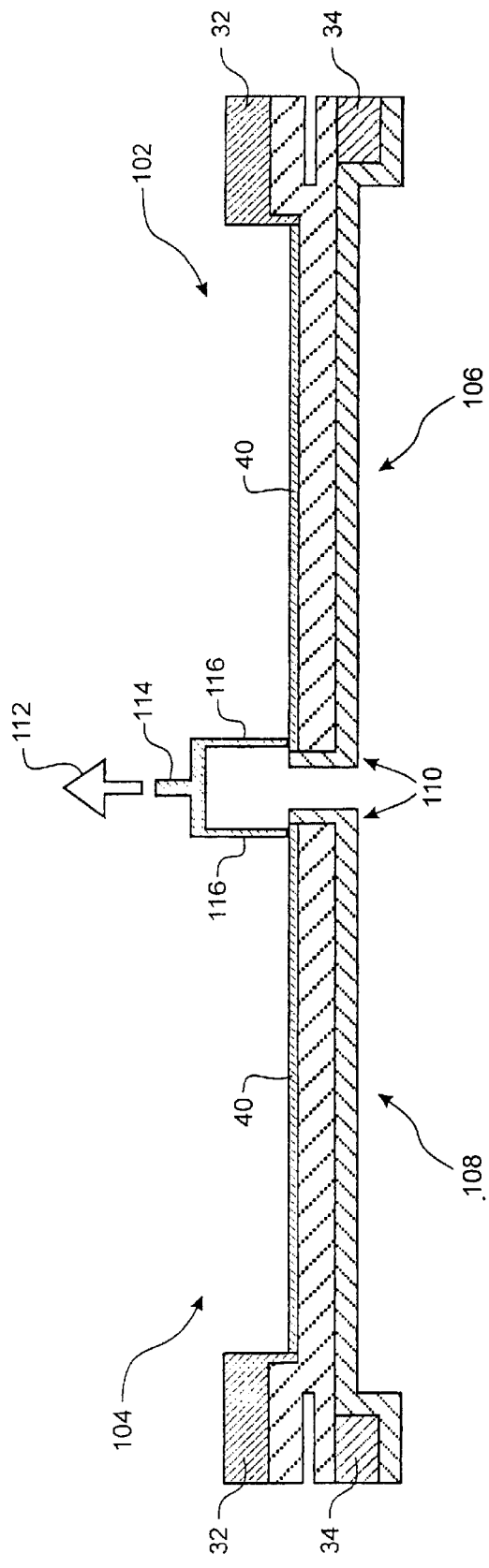
FIG. 3 is a plan view of a dual self-contained, in-plane MEMS thermal actuator including an interconnecting element used to facilitate greater linear displacement, in accordance with another embodiment of the present invention.

Referring to FIG. 3, in another embodiment of the present invention the thermal actuator includes dual composite beam actuators 102 and 104. A first and second composite beam 106 and 108 are disposed proximately such that the distal ends 110 of the respective beams face each other. The composite beams are adapted to move in unison in response to the selective application of thermal actuation. To assure uniform movement between the composite beams the beams will generally be comprised of identical layers; similar in material, quantity of layers, layer thickness and doping characteristics. The dual composite beams may generally be perceived as mirror images of one another.

As shown in FIG. 3, first and second composite beams are adapted to deflect in the direction of the arrow 112 when thermal energy is applied to the beams. When a single composite beam thermal actuator is used initial deflection of the beam is generally linear, however as the beam continues to deflect the pattern of deflection takes on an arcuate path. In this regard, as thermal energy is applied to the single composite beam actuator the beam has a limited range of relatively linear displacement before the displacement becomes increasingly more rotary or angular. In the FIG. 3 embodiment affixing an interconnecting element 114 to the distal ends of each composite beam increases linear displacement. The interconnecting element may be formed during the fabrication process that defines one of the layers of the composite beam. Thus, the interconnecting element may comprise silicon, gold, nickel or a similar suitable material. In a silicon embodiment the interconnecting element may be doped or undoped. If the interconnecting element is doped, the doping will typically occur simultaneous with the doping of the contacts 32 and 34 and the external surface 40 of the first layer. Additionally, if the interconnecting element is doped an actuating electrical conductive path may exist between the contact 32 of the first thermal actuator 102, the interconnecting element and the contact 32 of the second thermal actuator 104. This electrical configuration would make the second pair of contacts 34 optional. Alternately, the electrical path may exist between the second pair of contacts 34 and the doped interconnecting element thus, eliminating the need for the first set of contacts 32. Preferably, the interconnecting element is shaped and sized so as to impart flexibility. The flexible nature of the interconnecting element increases the linear displacement distance. In the FIG. 3 illustration, the interconnecting element has a preferred wishbone-like configuration. As the composite beams begin to deflect upward, the legs 116 of the wishbone-like configuration flex outward and result in an overall linear displacement of the interconnecting element in the direction of the arrow.

Additionally, the interconnecting element 114 may serve to simplify the overall heating arrangement of the dual composite beam thermal actuator. The interconnecting element may serve as a bridge that allows the electrical current to flow from one composite beam to the next. In the embodiment shown in FIG. 3 the interconnecting element uses the doped region of the first layer, typically silicon, as the transfer path between the first composite beam and the second composite beam. In such a configuration the electrical bridging capabilities of the interconnecting element may eliminate the need to supply electrical current individually to both composite beams. In an embodiment in which the interconnect is used as an electrical link it is more desirable to have the interconnect element comprise a metal or doped silicon so that electrical resistance can be minimized.

Figure 4:
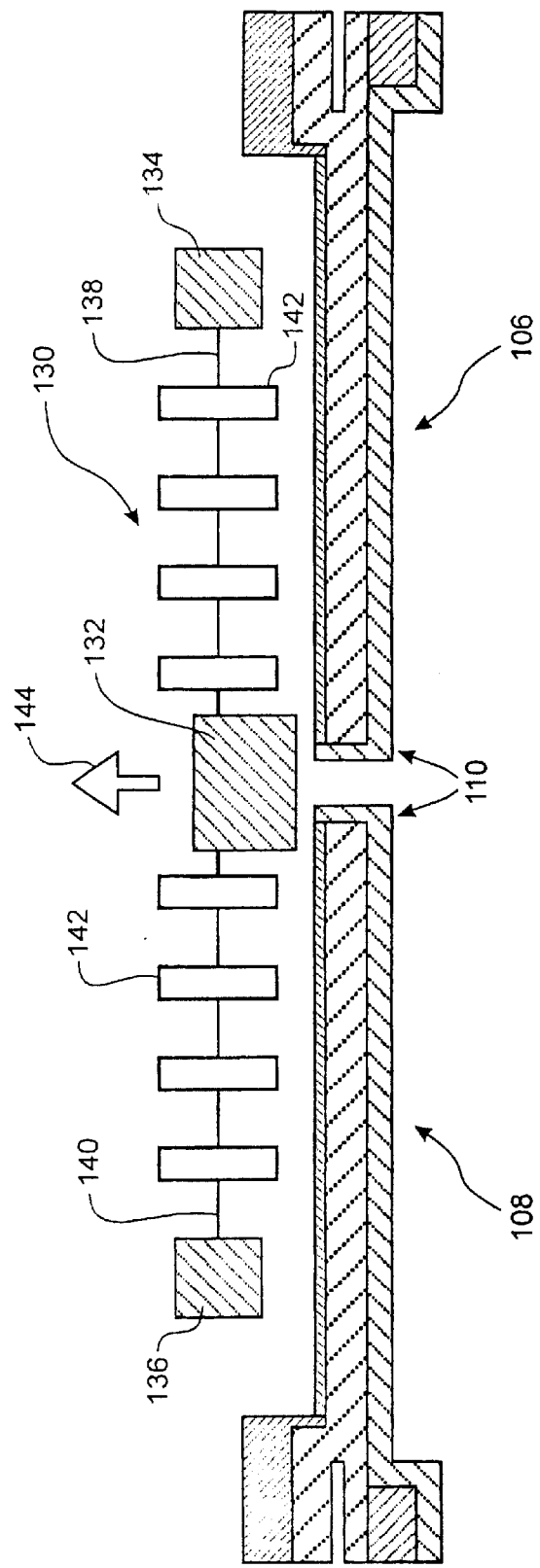
FIG. 4 is a plan view of a dual self-contained, in plane MEMS thermal actuator including a flexible beam construct used to facilitate greater linear displacement, in accordance with another embodiment of the present invention.

Another multi beam thermal actuator in accordance with yet another embodiment of the present invention is shown in FIG. 4. This embodiment provides for a flexible beam 130 construct disposed proximate the distal ends 110 of the dual composite beams 106 and 108. In much the same fashion as the dual composite beam thermal actuator shown in FIG. 3, the composite beams shown in the FIG. 4 embodiment will generally be perceived as mirror images of one another. The dual composite beams are in operable contact with a platform 132. The platform is disposed so that it is generally midway between the distal end of the first composite beam and the distal end of the second composite beam. The platform is operably connected to at least two anchors that are affixed to the microelectronic substrate, shown here as first and second anchors 134 and 136. In the embodiment shown in FIG. 4 the anchors are operably connected to the platform via first flexible beam 138 and second flexible beam 140. A series of springs 142 are located along the beams and serve to provide elasticity to the overall flexible beam structure. The fabrication of the platform, the anchors, the flexible beams and the springs can be part of the same patterning and etch processes used to form the first layer of the thermal actuator construct or they may entail separate processing steps. As such, the platform, the anchors, the flexible beams and the springs may comprise silicon, gold, nickel or any other suitable material.

In operation the dual thermal actuators are activated by thermal energy and provide for the generally simultaneous deflection of the distal ends of the composite beams. Upon actuation the distal ends of the composite beams contact the platform and provide the force necessary to move the platform in a linear direction (the path of the platform is shown as arrow 144). The beams and the springs allow for the platform to move in the linear direction and allow for the platform to relax into a non-actuated position upon deactivation of the thermal actuators. This embodiment of a dual beam actuator is advantageous because the spring-like beam structure compensates for any unequal movement of the respective composite beams and accordingly provides enhanced linear displacement characteristics as compared to the aforementioned described single composite beam embodiment.

Numerous other multi beam thermal actuator embodiments are also feasible and within the inventive concepts herein disclosed. For example, the composite beams may be arranged radially, with the distal ends directed toward a control hub to effectuate rotational movement. The hub may have levers extending from it that provide added actuation force. For a detailed discussion of rotary type MEMS structures see U.S. patent application Ser. No. 09/275,058 entitled "Microelectromechanical Rotary Structures" filed on May 23, 1999, in the name of inventors Hill et al. and assigned to MCNC, the assignee of the present invention. That application is herein incorporated by reference as if set forth fully herein. Additionally, the composite beams may be ganged together and/or configured in an array to benefit from force multiplication, thereby, effectively increasing the ability to move objects a greater distance and/or move larger objects.

Figure 5A:
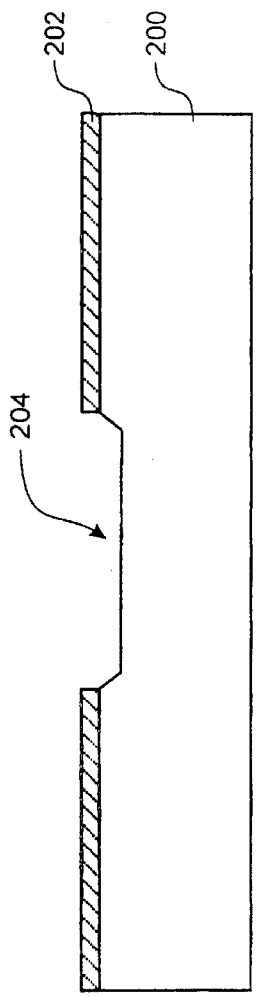
FIGS. 5A–5G illustrate various stages in the fabrication process of the self-contained, in-plane MEMS thermal actuator, in accordance with a method for making embodiment of the present invention.

FIGS. 5A–5G illustrate cross-sectional views of various fabrication stages in accordance with a method of making the thermal actuator of the present invention. Referring to FIG. 5A, a first microelectronic substrate 200 having a first oxide layer 202 is formed on the substrate and a trench 204 is defined through the first oxide layer and into the first microelectronic substrate. The first microelectronic substrate may comprise silicon although other suitable substrate material may also be used. The first oxide layer is typically disposed on the substrate by a conventional thermal oxidation process in which the substrate is exposed to an oxygen environment at elevated temperature and the oxide then grows on the substrate. In the embodiment in which the substrate is silicon, the first oxide layer may comprise silicon dioxide (SiO$_2$). The thickness of the first oxide layer will typically be about 2000 angstroms to about 8000 angstroms. The first oxide layer serves as a dielectric insulating layer and provides a means for subsequent defining and etching of the trench. Standard photolithography techniques may be used to pattern the region within the first oxide layer that will define the trench. A conventional wet etch process may then be used to develop the trench through the first oxide layer and into the substrate. The resulting trench typically has a depth within the substrate of about 10 microns to about 20 microns. The trench will also typically have a length slightly longer than the desired predetermined length of the composite beam and a width consistent with the maximum deflection of the beam, generally about 100 microns.

Figure 5B:
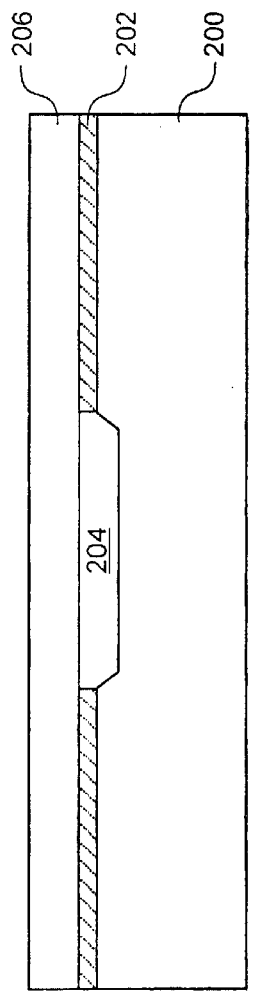

FIG. 5B illustrates the first microelectronic substrate having a trench defined therein after a second microelectronic substrate 206 has been attached and polished back. The second microelectronic substrate will subsequently form the first layer of the composite beam and a portion of the beam anchor. In a preferred embodiment the second substrate will comprise silicon. A standard fusion bonding process is used to affix the second microelectronic substrate to the first microelectronic substrate at the oxide layer interface. After the second microelectronic substrate is bonded it is polished back to the desired predetermined thickness. The thickness of the second microelectronic substrate will be consistent with the desired thickness or height of the resulting composite beam. Typically, the second microelectronic substrate will be polished back to a thickness of about 25 microns to about 50 microns.

Figure 5C:
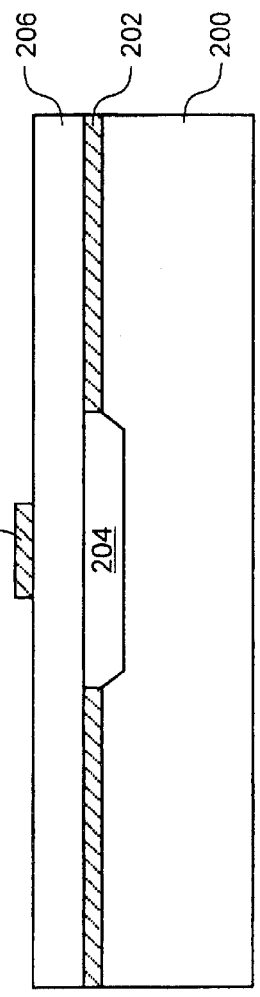

Referring to FIG. 5C shown is an oxide structure 208 formed on the second microelectronic substrate 206. The oxide structure(s) generally overlie the area that will comprise the composite beam and a portion of the anchors. The oxide structure(s) result from a second oxide layer (not shown in FIG. 5C) being disposed on the second substrate. The similar oxidation process to the one previously used for disposing the first oxide layer on the first substrate is typically used to dispose the second oxide layer. In the embodiment in which the second microelectronic substrate is silicon, the second oxide layer may comprise silicon dioxide (SiO$_2$). The thickness of the second oxide layer will typically be about 2000 angstroms to about 8000 angstroms. Standard photolithography techniques may be used to pattern the requisite oxide structure. A conventional wet etch process may then be used to develop the oxide structure(s). The resulting oxide structure(s) provide dielectric separation, preventing subsequent doping in areas underlying the oxide structure(s) and electrical isolation between subsequent conductive regions (i.e., doped regions and metallic regions).

Figure 5D:
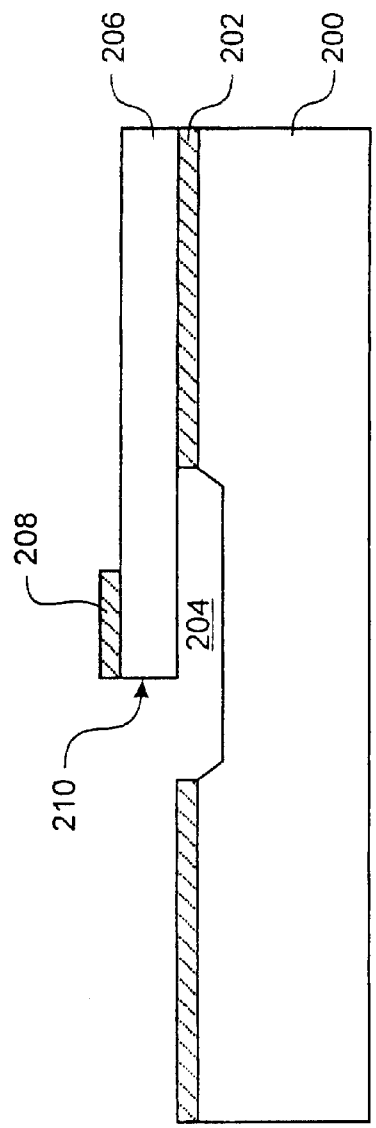

Further processing results in the structure shown in FIG. 5D in which a portion of the second microelectronic substrate has been etched away to expose one side of the thermal actuator. Standard photolithography techniques may be used to pattern a side of the overall thermal actuator, including a portion of the anchor structure and the first sidewall 210 of the first layer of the composite beam into the second substrate. A deep silicon reactive ion dry etch process may then be used to etch away a portion of the second substrate and expose a sidewall of the first layer of the composite beam and a portion of the anchor structure. A dry etch process is preferred at this stage to create the high aspect ratio of the composite beam (about 25–50 microns in depth relative to an about 5–7 microns width).

Figure 5E:
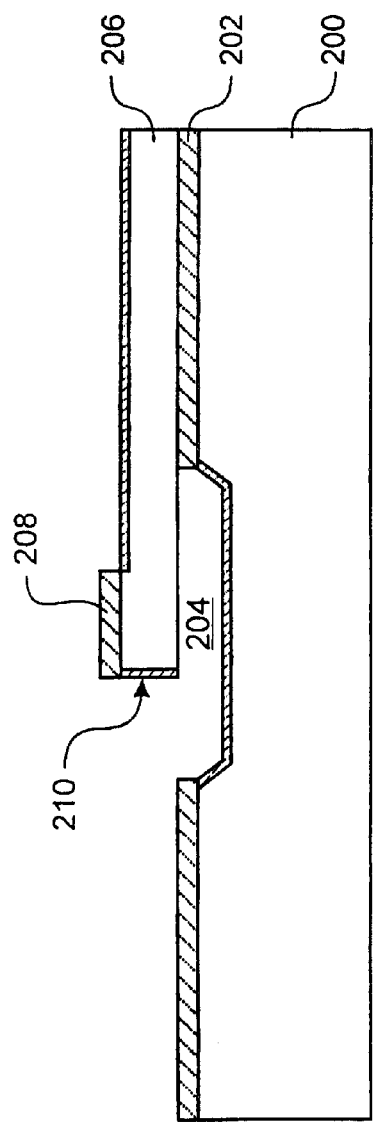

Referring to FIG. 5E, shown is the thermal actuator construct after exposed silicon surfaces have been subjected to a conventional diffusion doping process. The doping process provides for a continuous conductive path along the periphery of the composite beam and defines the contacts on the anchor. In a typical doping process phosphorus may be used as the doping impurity, although other materials may be used to create a highly doped region in the second silicon substrate. The doping process will create doped regions in all those area not protected by an oxide. As shown in FIG. 5E the resulting doped regions may include the first sidewall 210 of the first layer of the composite beam, the surface of the trench 204, the exposed portion of the remainder of the second microelectronic substrate 206 and the regions defining the contacts on the anchor (for the sake of not confusing the reader, the anchor structure and, thus, the contacts are not shown in the FIGS. 5A–5G illustrations). The doping of the surface of the trench and exposed portion of the remainder of the second microelectronic substrate is incidental. The doped region will typically have a depth into the substrate of about 2000 angstroms to about 8000 angstroms.

Figure 5F:
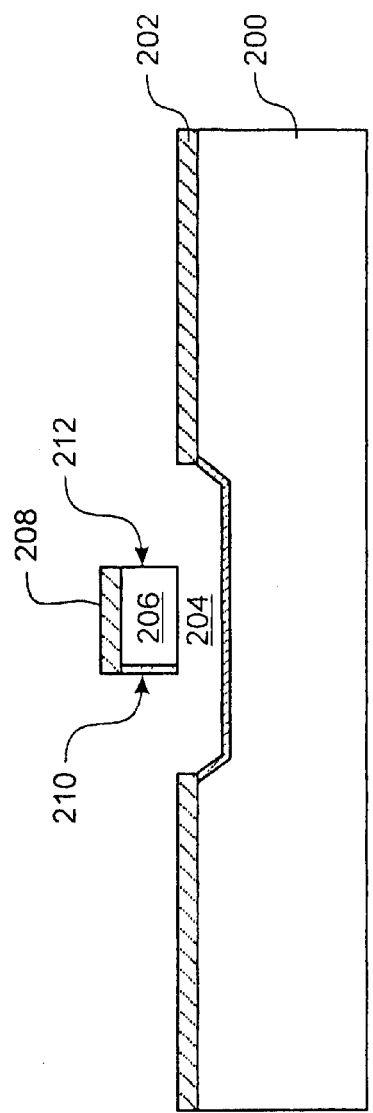

FIG. 5F depicts the thermal actuator after an additional etch process has revealed the definition of the second side of the thermal actuator. After the completion of this etch process all that remains of the second substrate are those structures of the thermal actuator; the first layer and a portion of the anchor structure, that comprise the material of the second substrate. FIG. 5F illustrates the definition of the second sidewall 212 of the first layer after completion of the additional etch process. Standard photolithography techniques may be used to pattern into the substrate the remaining side of the overall thermal actuator, including a portion of the anchor structure and the second sidewall of the first layer of the composite beam. A conventional reactive ion dry etch process may then be used to etch away the remainder of the second substrate and expose the second sidewall of the first layer of the composite beam and the remainder of the anchor structure.

Figure 5G:
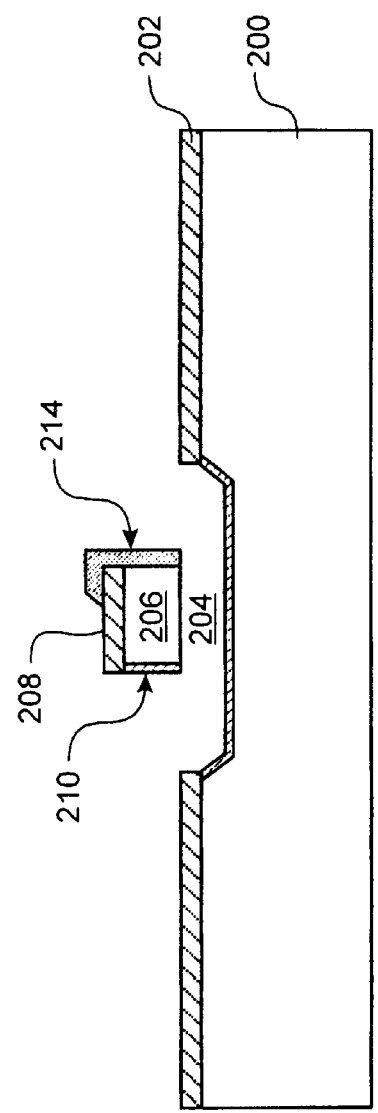

The thermal actuator of the present invention is shown in its completed form in FIG. 5G. A second layer 214, typically a metallic layer is disposed on the second sidewall 212 of the first layer. The second layer may comprise gold, nickel or another suitable material that has a coefficient of thermal expansion that differs from the coefficient of thermal expansion of the material chosen to comprise the first layer. In the embodiment in which the second layer comprises gold a conventional evaporation process is used to dispose the layer, typically the layer is about 2 to about 3 microns thick. In order to properly dispose the second layer on the vertical sidewall of the first layer and to assure proper uniform thickness of the second layer the overall thermal actuator construct may be placed at an angle during the evaporation process. The evaporation process will result in the second layer being disposed on surfaces not requiring such. In order to remove unnecessary second layer coverage, a standard photolithography process is used to pattern the areas requiring the second layer and a conventional wet etch process is used to define the areas requiring second layer coverage. In most instances, the etch process will result in second layer coverage extending above the second sidewall 212 and partially covering the surface of the second oxide layer 208. Additionally, the second layer may remain at the tip of the distal end of the composite beam (as shown in FIG. 1). Alternately, the tip of the distal end of the composite beam may comprise a doped region of the first layer. In the embodiment shown in FIG. 5G the first and second oxide layers 202 and 208 remain on the completed thermal actuator. It is also possible and within the inventive concepts herein disclosed to remove the oxide layer after the second layer has been disposed. The plan and cross-sectional views of FIGS. 1 and 2 illustrate an embodiment in which the oxide layers have been removed. In most instances leaving the oxide layers intact may be desirable as it eliminates the need for further processing and may prevent possible electrical shorting.

Accordingly, the fabrication method of this aspect of the present invention provides an efficient and repeatable technique for creating a vertical layered MEMS structure having a doped region that provides for a self-contained heating mechanism. The resulting MEMS thermal actuated devices are capable of generating large displacement forces across an in-plane, generally linear direction. These devices benefit from the capability of being able to operate at significantly lower temperature and power while consuming less surface area on the substrate.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for fabricating a self-contained MEMS thermal actuator having in-plane actuation capability, the method comprising the steps of:
    attaching a generally planar surface of a first semiconductor substrate to a generally planar surface of a second semiconductor substrate;
    defining a portion of a MEMS thermal actuator in the second substrate, the portion of the MEMS thermal actuator comprising a portion of at least one anchor affixed to the first semiconductor substrate and a first layer of a composite beam;
    doping a region of the first layer of the composite beam so as to define a conductive path in the first layer of the composite beam; and
    disposing a second layer on the undoped region of the first layer of the composite beam, the second layer comprising a material that responds differently to thermal actuation, such that the first and second layers of the composite beam will effectuate actuation of said composite beam along a predetermined path that extends substantially parallel to the generally planar surface of said microelectronic substrate.

2. The method of claim 1, further comprising the step of defining a trench in the first semiconductor substrate, wherein the trench underlies the composite beam structure.

3. The method of claim 1, wherein the step of doping further comprises doping a first sidewall of the composite beam so as to effectuate an external surface of the composite beam having an electrically conductive path.

4. The method of claim 1, further comprising the step of doping areas on the at least one anchor structure so as to define electrical contacts.

5. The method of claim 3, wherein the step of disposing a second layer further comprises disposing the second layer on a second sidewall opposite the first sidewall, such that the resulting composite beam has a first and second layer disposed perpendicularly with respect to the generally planar surface of the first substrate.

6. A method for fabricating a MEMS thermal actuator having in-plane actuation capability, the method comprising the steps of:
    disposing a first oxide layer on a first surface of a first semiconductor substrate;
    attaching a second semiconductor substrate on the first oxide layer;
    disposing a second oxide layer on the second semiconductor substrate;
    defining oxide structures in the second oxide layer that characteristically outline a portion of the MEMS actuator structure.
    defining a first portion of the MEMS actuator structure in the second semiconductor substrate, said first portion including a first sidewall of a composite beam and a first sidewall of an anchor structure;
    doping selectively the regions of the first and second semiconductor substrate not covered by oxide.
    defining a second portion of the MEMS actuator structure in the second semiconductor substrate, said second portion including a second sidewall of said composite beam and a second sidewall of an anchor structure; and
    disposing a metal layer on the second sidewall of the composite beam, such that the metal layer is disposed perpendicularly with respect to the first semiconductor substrate.

7. The method of claim 6, further comprising the step of defining a trench through the first oxide layer in to the first semiconductor substrate, wherein the trench underlies the plan view outline of the composite beam structure of the MEMS actuator device.

8. The method of claim 6, further comprising the step of releasing the second semiconductor substrate from the first oxide layer by selectively etching the first oxide layer in those regions underlying the composite beam.

9. The method of claim 6, wherein the step of doping further comprises doping the first sidewall of the composite beam so as to effectuate an external surface of the composite beam having a self-contained heating mechanism.

10. The method of claim 6, wherein the step of doping further comprises doping areas on the anchor structure so as to define electrical contacts.

* * * * *